(12) United States Patent
Kim

(10) Patent No.: US 10,395,898 B2
(45) Date of Patent: Aug. 27, 2019

(54) SUBSTRATE TREATING APPARATUS, SUBSTRATE TREATING METHOD, AND PLASMA GENERATING UNIT

(71) Applicant: PSK INC., Gyeonggi-do (KR)

(72) Inventor: Aram Kim, Gyeonggi-do (KR)

(73) Assignee: PSK INC., Gyeonggi-Do (KR)

( * ) Notice: Subject to any disclaimer, the term of this patent is extended or adjusted under 35 U.S.C. 154(b) by 0 days.

(21) Appl. No.: 15/682,858

(22) Filed: Aug. 22, 2017

(65) Prior Publication Data
US 2019/0051498 A1  Feb. 14, 2019

(30) Foreign Application Priority Data
Aug. 9, 2017 (KR) .................. 10-2017-0100832

(51) Int. Cl.
  *H01J 37/32* (2006.01)
  *H01L 21/3065* (2006.01)
  *H01L 21/67* (2006.01)

(52) U.S. Cl.
  CPC .. *H01J 37/32339* (2013.01); *H01J 37/32715* (2013.01); *H01L 21/67103* (2013.01); *H01J 2237/334* (2013.01); *H01L 21/67069* (2013.01)

(58) Field of Classification Search
  None
  See application file for complete search history.

(56) References Cited

U.S. PATENT DOCUMENTS

| | | | | |
|---|---|---|---|---|
| 6,180,019 | B1* | 1/2001 | Kazumi | H01J 37/32009 118/723 I |
| 2003/0141285 | A1* | 7/2003 | Tachino | H01J 37/321 219/121.54 |
| 2010/0230053 | A1* | 9/2010 | Nishio | H01J 37/32091 156/345.49 |
| 2014/0263181 | A1* | 9/2014 | Park | C23C 16/45557 216/68 |

FOREIGN PATENT DOCUMENTS

| | | | |
|---|---|---|---|
| JP | 2000-12287 | * | 1/2000 |
| JP | 2000012287 A | | 1/2000 |
| JP | 2001118697 A | | 4/2001 |
| JP | 2002210330 A | | 7/2002 |
| JP | 2011198539 A | | 10/2011 |
| JP | 2012186197 A | | 9/2012 |
| KR | 10-1763277 B1 | | 7/2017 |

* cited by examiner

*Primary Examiner* — Shamim Ahmed
(74) *Attorney, Agent, or Firm* — Carter, Deluca & Farrell LLP

(57) ABSTRACT

Disclosed are a substrate treating apparatus, a substrate treating method, and a plasma generating unit. The substrate treating apparatus includes a housing configured to provide a treatment space, in which a substrate is treated, a support unit configured to support a substrate in the treatment space, a plasma generating unit disposed outside the housing and configured to excite plasma from a gas and supply the excited plasma to the treatment space, and a controller, wherein the plasma generating unit includes a plasma generating chamber having a space, into which a gas is introduced, a first antenna wound to surround the plasma gen- (Continued)

erating chamber and connected to a power source through an electric wire, a second antenna wound around the plasma generating chamber and connected to the power source through an auxiliary electric wire, and a switch configured to switch on and off the auxiliary electric wire.

11 Claims, 8 Drawing Sheets

SUBSTRATE TREATING APPARATUS, SUBSTRATE TREATING METHOD, AND PLASMA GENERATING UNIT

CROSS-REFERENCE TO RELATED APPLICATIONS

A claim for priority under 35 U.S.C. § 119 is made to Korean Patent Application No. 10-2017-0100832 filed on Aug. 9, 2017, in the Korean Intellectual Property Office, the entire contents of which are hereby incorporated by reference.

BACKGROUND

Embodiments of the inventive concept described herein relate to a substrate treating apparatus, a substrate treating method, and a plasma generating unit.

Plasma corresponds to an ionized gas including ions, electrons, radicals, and the like. The plasma is generated by very high temperature, strong electric fields, or radio frequency (RF) electromagnetic fields.

The plasma is used for treating a substrate to manufacture a semiconductor device. For example, the plasma may be utilized in a lithographic process that uses photoresist. As an example, the plasma may be utilized when various fine circuit patterns such as lines or space patterns on a substrate are formed or during an ashing process of removing a photoresist film used for a mask in an ion implantation process.

Generally, a substrate treating apparatus includes a plasma generating apparatus. The plasma generating apparatus includes an antenna member. The antenna member generates electromagnetic fields. The generated electromagnetic fields excite a process gas into a plasma state.

SUMMARY

Embodiments of the inventive concept provide a substrate treating apparatus that efficiently treats a substrate, a substrate treating method, and a plasma generating unit.

Embodiments of the inventive concept also provide a substrate treating apparatus that efficiently excites plasma, a substrate treating method, and a plasma generating unit.

Embodiments of the inventive concept also provide a substrate treating apparatus that may control heat generated in a process of exciting plasma, a substrate treating method, and a plasma generating unit.

In accordance with an aspect of the inventive concept, there is provided a substrate treating apparatus including a housing configured to provide a treatment space, in which a substrate is treated, a support unit configured to support a substrate in the treatment space, a plasma generating unit disposed outside the housing and configured to excite plasma from a gas and supply the excited plasma to the treatment space, and a controller, wherein the plasma generating unit includes a plasma generating chamber having a space, into which a gas is introduced, a first antenna wound to surround the plasma generating chamber and connected to a power source through an electric wire, a second antenna wound around the plasma generating chamber and connected to the power source through an auxiliary electric wire, and a switch configured to switch on and off the auxiliary electric wire.

The controller may initiate ignition of plasma while the switch is switched off, and may switch on the switch after a preset time period elapses after the ignition of the plasma.

The plasma generating unit may further include an ammeter located in the wire, and the controller may switch on the switch if a deviation value of a current detected by the ammeter with respect to a normal state current becomes a preset value or less, after the ignition of the plasma is initiated.

The plasma generating unit may further include an ammeter located in the wire, and the controller may switch on the switch if a deviation value of a current detected by the ammeter with respect to a normal state current becomes a preset value or less and a preset time period elapses, after the ignition of the plasma is initiated.

The plasma generating unit may further include a voltmeter connected in parallel to the first antenna, and the controller may switch on the switch if a deviation value of a voltage detected by the voltmeter with respect to a normal state voltage becomes a preset value or less, after the ignition of the plasma is initiated.

The plasma generating unit may further include a voltmeter connected in parallel to the first antenna, and the controller may switch on the switch if a deviation value of a voltage detected by the voltmeter with respect to a normal state voltage becomes a preset value or less and a preset time period elapses, after the ignition of the plasma is initiated.

A length between an upper end and a lower end of the second antenna may be longer than a length between an upper end and a lower end of the first antenna.

The second antenna may be wound to include an area in which the first antenna is wound.

The second antenna may be connected in parallel to the first antenna.

The second antenna may be wound in the same direction as the first antenna.

In accordance with another aspect of the inventive concept, there is provided a substrate treating method including initiating ignition of plasma by connecting a first antenna wound on an upper portion of a chamber to a power source, and if a preset time period elapses after the ignition of the plasma is initiated, connecting a second antenna to the first antenna in parallel.

The second antenna may be connected to the first antenna if a deviation value of a current flowing through the first antenna with respect to a normal state current is a preset value or less, after the ignition of the plasma is initiated.

The second antenna may be connected to the first antenna if a deviation value of a current flowing through the first antenna with respect to a normal state current is a preset value or less and a preset time period elapses, after the ignition of the plasma is initiated.

The second antenna may be connected to the first antenna if a deviation value of a voltage applied to the first antenna with respect to a normal state voltage is a preset value or less, after the ignition of the plasma is initiated.

The second antenna may be connected to the first antenna if a deviation value of a voltage applied to the first antenna with respect to a normal state voltage is a preset value or less and a preset time period elapses, after the ignition of the plasma is initiated.

The second antenna may be wound in the same direction as the first antenna.

A length between an upper end and a lower end of the second antenna may be longer than a length between an upper end and a lower end of the first antenna.

The second antenna may be wound to include an area in which the first antenna is wound.

In accordance with another aspect of the inventive concept, there is provided a plasma generating unit including a plasma generating chamber having a space, into which a gas is introduced, a first antenna wound to surround the plasma generating chamber and connected to a power source through an electric wire, a second antenna wound around the plasma generating chamber and connected to the power source through an auxiliary electric wire, a switch configured to switch on and off the auxiliary electric wire, and a controller.

The controller may initiate ignition of plasma while the switch is switched off, and may switch on the switch after a preset time period elapses after the ignition of the plasma.

The plasma generating unit may further include an ammeter located in the electric wire, and the controller may switch on the switch if a deviation value of a current detected by the ammeter with respect to a normal state current becomes a preset value or less, after the ignition of the plasma is initiated.

The plasma generating unit may further include an ammeter located in the electric wire, and the controller may switch on the switch if a deviation value of a current detected by the ammeter with respect to a normal state current becomes a preset value or less and a preset time period elapses, after the ignition of the plasma is initiated.

The plasma generating unit may further include a voltmeter connected in parallel to the first antenna, and the controller may switch on the switch if a deviation value of a voltage detected by the voltmeter with respect to a normal state voltage becomes a preset value or less, after the ignition of the plasma is initiated.

The plasma generating unit may further include a voltmeter connected in parallel to the first antenna, and the controller may switch on the switch if a deviation value of a voltage detected by the voltmeter with respect to a normal state voltage becomes a preset value or less and a preset time period elapses, after the ignition of the plasma is initiated.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, exemplary embodiments of the inventive concept will be described in more detail with reference to the accompanying drawings. The embodiments of the inventive concept may be modified in various forms, and the scope of the inventive concept should not be construed to be limited to the following embodiments. The embodiments of the inventive concept are provided to describe the inventive concept for those skilled in the art more completely. Accordingly, the shapes of the components of the drawings are exaggerated to emphasize clearer description thereof.

Figure 1:
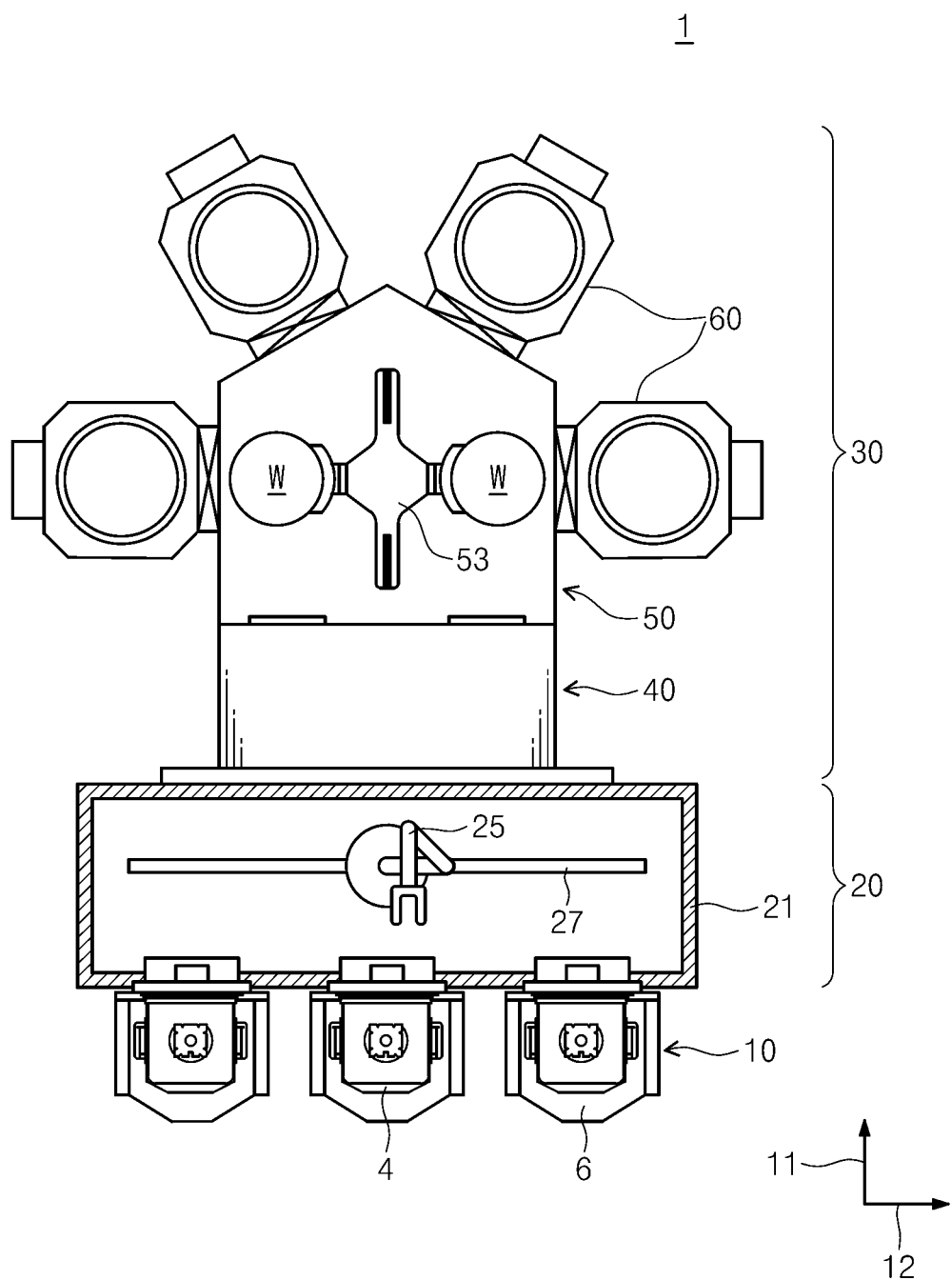
FIG. 1 is a plan view illustrating a substrate treating apparatus according to an embodiment of the inventive concept.

FIG. 1 is a plan view illustrating a substrate treating apparatus according to an embodiment of the inventive concept.

Referring to FIG. 1, the substrate treating apparatus 1 has an equipment front end module (EFEM) 20 and a process executing unit 30. The equipment front end module 20 and the process executing unit 30 are disposed in one direction. Hereafter, a direction in which the equipment front end module 20 and the process executing unit 30 are arranged will be referred to as a first direction 11, and a direction that is perpendicular to the first direction 11 when viewed from the top will be referred to as a second direction 12.

The equipment front end module 20 has a load port 10 and a feeding frame 21. The load port 10 is disposed in front of the equipment front end module 20 in the first direction 11. The load port 10 has a plurality of supports 6. The supports 6 are disposed in a row in the second direction 12, and substrates W, which are to be provided to a process and carriers 4 (for example, cassettes or FOUPs), in which the substrates W is received, the processes of which have been executed, are located in the supports 6. Substrates W, which are be provided to processes, and substrate W, the processes of which have been executed, are received in the carriers 4. The feeding frame 21 is disposed between the load port 10 and a process executing chamber 30. The feeding frame 21 includes a first feeding robot 25 disposed in the interior thereof and configured to feed a substrate W between the load port 10 and the process executing unit 30. The first feeding robot 25 moves along a feeding rail 27 provided in the second direction 12 and feeds a substrate W between the carrier 4 and the process executing chamber 30.

The process executing chamber 30 includes a load lock chamber 40, a transfer chamber 50, and a process chamber 60.

The load lock chamber 40 is disposed adjacent to the feeding frame 21. As an example, the load lock chamber 40 may be disposed between the transfer chamber 50 and the equipment front end module 20. The load lock chamber 40 provides a spaces in which a substrate W, which is to be provided to a process, stands by before the substrate W is fed to the process chamber 60 or before the substrate W, a process of which has been executed, is fed to the equipment front end module 20.

The transfer chamber 50 is disposed adjacent to the load lock chamber 40. The transfer chamber 50 has a body that is polygonal when viewed from the top. Referring to FIG. 1, the transfer chamber 50 has a body that is pentagonal when viewed from the top. The load lock chamber 40 and a plurality of process chambers 60 are disposed outside the body along a circumference of the body. Passages (not illustrated) through which the substrate W is introduced and extracted are formed in side walls of the body, and the passages connect the transfer chamber 50 and the load lock chamber 40 or the process chambers 60. Each of the passages is provided with a door (not illustrated) that seals the interior of the passage by opening and closing the passage. A second feeding robot 53 that feeds the substrate W between the load lock chamber 40 and the process chambers 60 is disposed in an interior space of the transfer chamber 50. The second feeding robot 53 feeds an untreated substrate W that stands by in the load lock chamber 40 to the process chamber 60 or feeds a substrate W, a process of which has been executed, to the load lock chamber 40. Further, the substrate W is fed between the process chambers 60 to sequentially provide the substrate W to the plurality of process chambers 60. As illustrated in FIG. 1, when the transfer chamber 50 has a pentagonal body, the load lock chamber 40 is disposed on a side wall that is adjacent to the equipment front end module 20 and the process chambers 60 are continuously disposed on the remaining side walls. The transfer chamber 50 may be provided in various forms according to the process module required, as well as in the above-described shape.

The process chambers 60 are disposed along the circumference of the transfer chamber 50. A plurality of process chambers 60 may be provided. The processes for the substrate W are executed in the process chambers 60. The process chamber 60 receives a substrate W from the second feeding robot 53 and executes a process, and provides the substrate W, the process of which has been executed, to the second feeding robot 53. The processes executed in the process chambers 60 may be different. The process executed by the chamber 60 may be one of the processes of producing a semiconductor device or a display panel by using a substrate W. For example, the process executed by the process chamber 60 may be one of processes, such as a deposition process, an etching process, a cleaning process, a development process, an ashing process, and a bake process. Hereinafter, a case in which the process chamber 60 includes a process module 100 (see FIG. 2) that treats a substrate W by using plasma will be described as an example.

Figure 2:
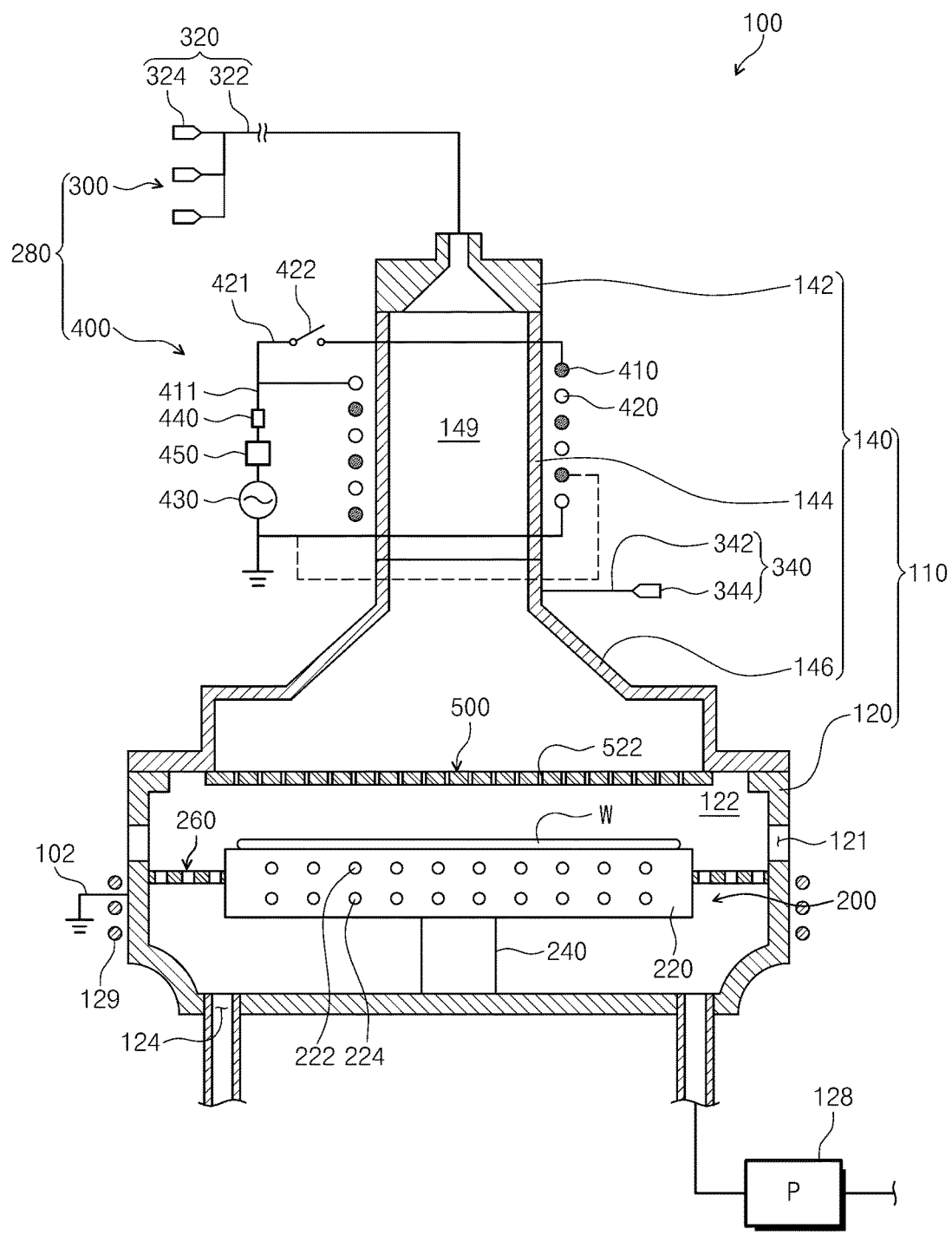
FIG. 2 is a view illustrating a process module that may be provided in a process chamber of FIG. 1.

FIG. 2 is a view illustrating a process module that may be provided in a process chamber of FIG. 1.

Referring to FIG. 2, the process module 100 may be located in the process chamber 60. The process module 100 treats the substrate W by using plasma. As an example, the process module 100 may etch a thin film on the substrate W. The thin film may be various kinds of films, such as a poly silicon film, a silicon oxide film, and a silicon nitride film. Further, the thin film may be a natural oxide film or an oxide film produced chemically.

The process module 100 includes a housing 120, a plasma generating chamber 140, a support unit 200, and a process gas supply unit 280.

The housing 120 provides a treatment space 122 in which a substrate W is treated by plasma. The housing 120 has a space 122, an upper side of which is opened, in the interior thereof. The housing 120 may have a substantially cylindrical shape. An opening 120 is formed on a side wall of the housing 121. The substrate W is introduced into and extracted from the interior of the housing 120 through the opening 121. The opening 121 is opened and closed by an opening/closing member, such as a door (not illustrated). The opening/closing member closes while the substrate W is treated in the housing 120, and opens the opening 121 while the substrate W is carried into and carried out of the interior of the housing 120.

An exhaust hole 124 is formed on a bottom surface of the housing 120. An exhaust line 126 is connected to the exhaust hole 122. A pump 128 is installed in the exhaust line 126. The pump 128 adjusts a pressure in the housing 120 to a process pressure. Residual gases and reaction by-products in the housing 120 are discharged to the outside of the housing 120 through the exhaust line 126. Then, the gases and reaction side-products that stay in the interior of the housing 120 may be introduced into the exhaust hole 124 via holes of the exhaust plate 260. A wall heater 129 may be provided outside the housing 120. The wall heater 129 may have a coil shape. Selectively, the wall heater 129 may be provided inside a side wall of the process chamber 60.

The plasma generating chamber 140 provides a space 149 in which plasma is generated from a process gas. The plasma generating chamber 140 functions as a plasma generating unit together with an antenna unit 400. The plasma generating chamber 140 is located outside the housing 120. According to an embodiment, the plasma generating chamber 140 is located on the upper side of the housing 120 and is coupled to the housing 120. The plasma generating chamber 140 has a gas port 142, a discharge chamber 144, and a diffusion chamber 146. The gas port 142, the discharge chamber 144, and the diffusion chamber 146 are sequentially provided in a direction that extends from the top to the bottom. The gas port 142 receives a gas from the outside. The discharge chamber 144 has a hollow cylindrical shape. When viewed from the top, the space 149 in the discharge chamber 144 may be narrower than the space 121 in the housing 120. Plasma is generated from the gas in the discharge chamber 144. The diffusion chamber 146 supplies the plasma generated in the discharge chamber 144 to the housing 120. The space in the diffusion chamber 146 has a part that becomes gradually wider as it goes downwards. A lower end of the diffusion chamber 146 is coupled to an upper end of the housing 120, and a sealing member (not illustrated) is provided between the diffusion chamber 144 and the housing 120 for sealing from the outside.

Both the housing 120 and the plasma generating chamber 140 may be formed of a conductive material. As an example, the housing 120 and the plasma generating chamber 140 may be formed of an aluminum material. Selectively, the housing 120 and the plasma generating chamber 140 may be formed of a metallic material and a non-metallic material together. As an example, the metallic material may be aluminum (Al) the non-metallic material may be $Al_2O_3$.

The support unit 200 supports the substrate W. The support unit 200 has a support plate 220 and a support shaft 240. The support plate 220 is located in the treatment chamber 122 and has a disk shape. The support plate 220 is supported by the support shaft 240. The substrate W is positioned on an upper surface of the support plate 220. An electrode (not illustrated) may be provided in the interior of the support plate 220, and the substrate W may be fixed to the support plate 220 through an electrostatic force. Selectively, the substrate W may be fixed to the support plate 220 by a mechanical clamp, or may be positioned on the support plate 220 without using a separate fixing unit. A heating member 222 may be provided in the interior of the support plate 220. According to an example, the heating member 222 may be a heating wire. Further, a cooling member 224 may be provided in the interior of the support plate 220. The cooling member 224 may be a cooling line, through which cooling water flows. The heating member 222 heats the substrate W to a preset temperature, and the cooling member 224 compulsorily cools the substrate W. Selectively, the process module 100 may not be provided with a heating member 222 or a cooling member 224. The support unit 200 may have lift holes (not illustrated). A lift pin (not illustrated) is provided in each of the lift holes. When the substrate W is loaded on or unloaded from the support unit 200, the lift pins elevates along the lift holes.

Further, the exhaust plate 260 may be located in the treatment space 122 of the housing 120. As an example, the exhaust plate 260 may be provided to connect the support unit 200 and an inner surface of the housing 120. Unlike this, the exhaust plate 260 may be provided to connect the inner surface of the housing 120 and the lift pin (not illustrated). The exhaust plate 260 includes a hole. The exhaust plate 260 may exhaust the gases and reaction side-products residing in the housing 120 to the exhaust hole 124. Selectively, the exhaust plate 260 may not be provided in the treatment space 122 of the housing 120.

The process gas supply unit 280 has a gas supply unit 300 and a plasma source 400. The process gas supply unit 280 supplies the process gas in the plasma state to the interior of the process module 100.

The gas supply unit 300 has a gas supply member 320 and an additional gas supply member 340.

The gas supply member 320 has a gas supply line 322 and a gas storage unit 324. The gas supply line 322 is coupled to the gas port 142. The gas supplied through the gas port 142 is introduced into the discharge chamber 144, and is excited into plasma in the discharge chamber 144. The gas may include difluoromethane ($CH_2F_2$), nitrogen ($N_2$), and oxygen ($O_2$). Selectively, the gas may further include another kind of gas, such as tetrafluoromethane ($CF_4$).

The additional gas supply member 340 has an additional gas supply line 342 and an additional gas storage unit 344. The additional gas is supplied onto a path along which the plasma generated from the gas flows to the housing 120. As an example, the additional gas supply line 342 is coupled to the discharge chamber 144 in an area below the antenna 420, which will be described below. A second source gas may include nitrogen trifluoride ($NF_3$).

Due to the above-mentioned structure, the gas is directly excited into plasma by electric power, and the additional gas is excited into plasma through a reaction with the gas.

In the above-mentioned example, the kinds of the gas and the additional gas may be variously changed. Further, only the gas supply member 320 may be provided while the additional gas supply member 340 is not provided.

The antenna unit excites the first gas into a plasma state.

A baffle 500 is located between the housing 120 and the plasma generating chamber 140. The baffle 500 includes a baffle hole 522. The baffle 500 uniformly maintains the density and flows of the plasma in the entire area in the housing 120 when the plasma is supplied to the substrate W. The plasma may be supplied through the baffle hole 522. The baffle 500 is grounded. According an example, the baffle 500 may contact the process chamber 60 to be grounded through the process chamber 60. Selectively, the baffle 500 may be directly connected to a separate ground line. Accordingly, the radicals are supplied to the housing 120 by the baffle 500, and introduction of the ions and electrons into the housing 120 is interrupted. The baffle 500 is fixed to the process chamber 60. As an example, the baffle 500 may be coupled to a lower end of the plasma generating chamber 140.

The antenna unit 400 includes a first antenna 410 and a second antenna 420.

The first antenna 410 is provided to surround an outer circumference of the plasma generating chamber 140 a plurality of times. The first antenna 410 is connected to a power source 430 through an electric wire 411. The first antenna 410 may be wound at a regular interval. A matching circuit 450 may be located in the electric wire 411. The matching circuit 450 performs impedance matching.

The second antenna 420 is provided to surround an outer circumference of the plasma generating chamber 140 a plurality of times. The second antenna 420 may be wound at a regular interval. The second antenna 420 may be wound to overlap with an area in which the first antenna 410 is wound and a partial area. As an example, the second antenna 420 may be wound outside the plasma generating chamber 140 to be located alternately with the first antenna 410. The second antenna 420 is provided to be wound in the same direction as the first antenna 410. Accordingly, an electric voltage is applied to the first antenna 410 and the second antenna 420, magnetic fluxes in the same direction are formed.

The second antenna 420 is connected to the power source 430 through an auxiliary electric wire 421. As an example, the auxiliary electric wire 421 may be provided to be branched from the electric wire 411. As another example, one or opposite ends of the auxiliary electric wire 421 may be provided to be directly connected to the power source 430. The second antenna 420 is connected to the power source 430 to be connected in parallel to the first antenna 410.

Figure 3:
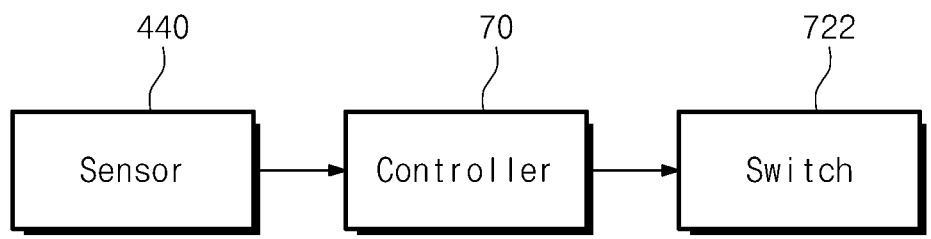
FIG. 3 is a view illustrating some control relationships of the process module.

FIG. 3 is a view illustrating some control relationships of the process module.

The electric power 411 is provided with a sensor 440 configured to detect a state of the first antenna 410. The sensor 440 may be an ammeter. The ammeter may be a high frequency ammeter to be operated in a power source 430 having a high frequency wave. When the auxiliary electric wire 421 is branched from the electric wire 411, the sensor 440 may be located in a direction that faces the first antenna 410 or is opposite to the first antenna 410 with respect to a node from which the auxiliary electric wire 421 is branched.

A switch 422 configured to switch on and off the auxiliary electric wire 421 is located in the auxiliary electric wire 421. The controller 70 switches on and off the switch 422 based on information provided by the sensor 440.

Figure 4:
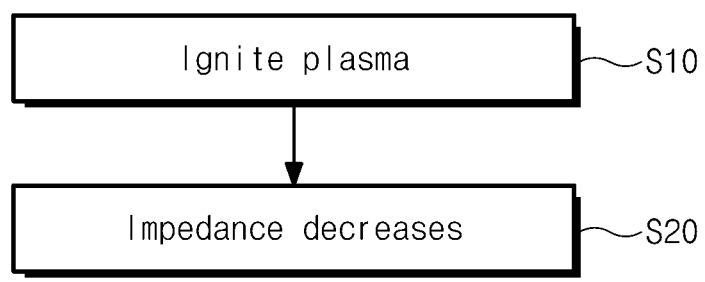
FIG. 4 is a view illustrating a process of adjusting an antenna unit.

FIG. 4 is a view illustrating a process of adjusting an antenna unit.

Referring to FIG. 4, if the treated substrate is carried in and is located in the support unit, ignition of plasma is achieved (S10). For the ignition of plasma, the gas supply member 320 initiates supply of the gas, and the power source 430 supplies electric power to the antenna unit 400. The power source 430 initiates supply of electric power at the same time when the gas supply member 320 initiates supply of gas. Further, the power source 430 may initiate supply of electric power prior to the supply of the gas by the gas supply member 320 by a preset time period, or may initiate supply of electric power after a preset time period elapses from the supply of the gas by the gas supply member 320. If electric power is supplied to the antenna unit 400, the ignition of the gas is initiated in a plasma state by an electromagnetic field formed by the antenna unit 400. During the ignition of the plasma, the controller 70 switches off the switch 422 to supply electric power only to the first antenna 410. If the magnitude of the voltage applied to the antenna unit 400 when the ignition of the plasma is initiated is small, the plasma is not smoothly generated. Meanwhile, in the substrate treating apparatus according to the inventive concept, the second antenna 420 is provided while not being connected when the ignition of the plasma is initiated, and a voltage applied to the antenna unit 400 increases because an equivalent impedance of the antenna unit 400 increases. Accordingly, during the ignition of the plasma, the generation of the plasma may be smoothly initiated.

Figure 5:
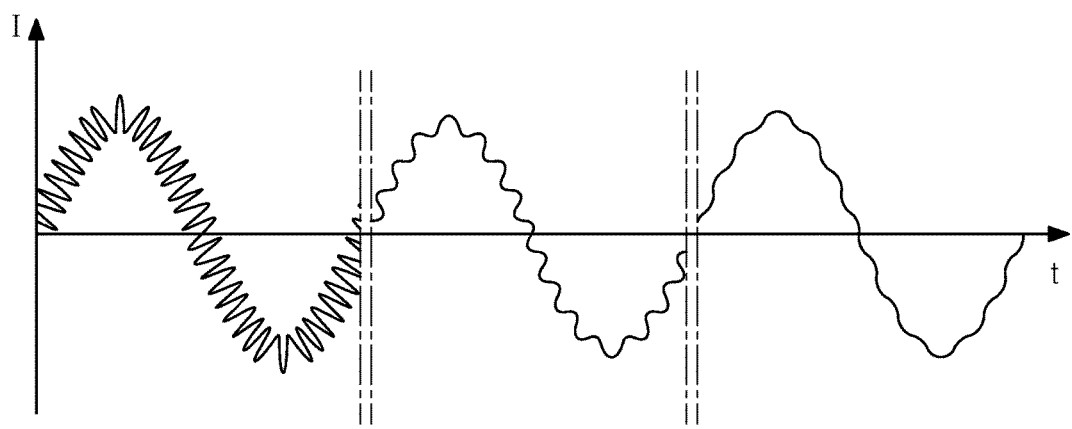
FIG. 5 is a view illustrating currents flowing through a first antenna after ignition of plasma.
Figure 6:
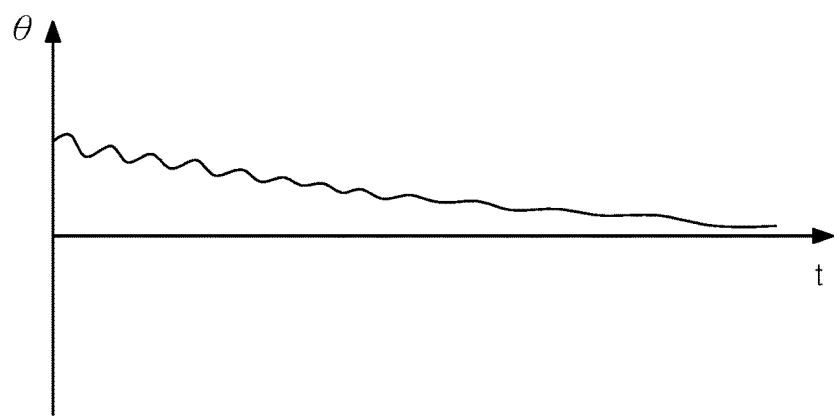
FIG. 6 is a view illustrating a deviation value of a current with respect to a normal state.

FIG. 5 is a view illustrating currents flowing through a first antenna after ignition of plasma. FIG. 6 is a view illustrating a deviation value of a current with respect to a normal state.

If the ignition of the plasma is initiated, the plasma includes charged particles so that a mutual inductance is generated between the antenna unit 400 and the plasma. Due to the mutual inductance by the plasma, a current flowing through the first antenna 410 is influenced by the state of the plasma. Immediately after the ignition of the plasma is initiated, the quantity, density, and distribution of the plasma is unstable so that the current flowing through the first antenna 410 also becomes unstable. Further, if the state of the plasma becomes stable over time, the current flowing through the first antenna 410 also becomes close to a normal state.

After the ignition of the plasma is initiated, the controller 70 switches on the switch 422 in consideration of the state of the current flowing through the first antenna 410. If the switch 422 is switched on, the second antenna 420 is connected in parallel to the first antenna 410 so that the equivalent impedance of the antenna unit 400 decreases (S20).

As an example, if a deviation $\theta$ of the current flowing through the first antenna 410 with respect to a normal state current is a preset value or less, the controller 70 may determine that the state of the plasma becomes stable and may switch on the switch 422. Further, if the state is maintained for a preset time period after the deviation $\theta$ of the current flowing through the first antenna 410 with respect to the normal state current is a preset value or less, the controller 70 switches on the switch 422.

If the equivalent impedance of the antenna unit 400 decreases, the magnitude of the current flowing through the antenna unit 400 increases. If the magnitude of the current flowing through the antenna unit 400 increases, the magnitude of the electromagnetic field induced by the current increases so that the efficiency of exciting the plasma may be improved and the density of the excited plasma may increase.

If the magnitude of the voltage applied to the antenna unit 400 increases, a larger amount of particles may be generated in the treatment of the substrate through the excited plasma. This problem may be caused by the fact that the plasma has energy that is higher than necessary. Meanwhile, in the substrate treating apparatus according to the inventive concept, if the second antenna 420 is connected and the equivalent impedance of the antenna unit 400 decreases, the magnitude of the voltage applied to the antenna unit 400 decreases due to an internal resistance of the power source 430, a resistance of the electric wire 411, and the like. Accordingly, particles generated through plasma ion sputtering and the like may be reduced.

Figure 7:
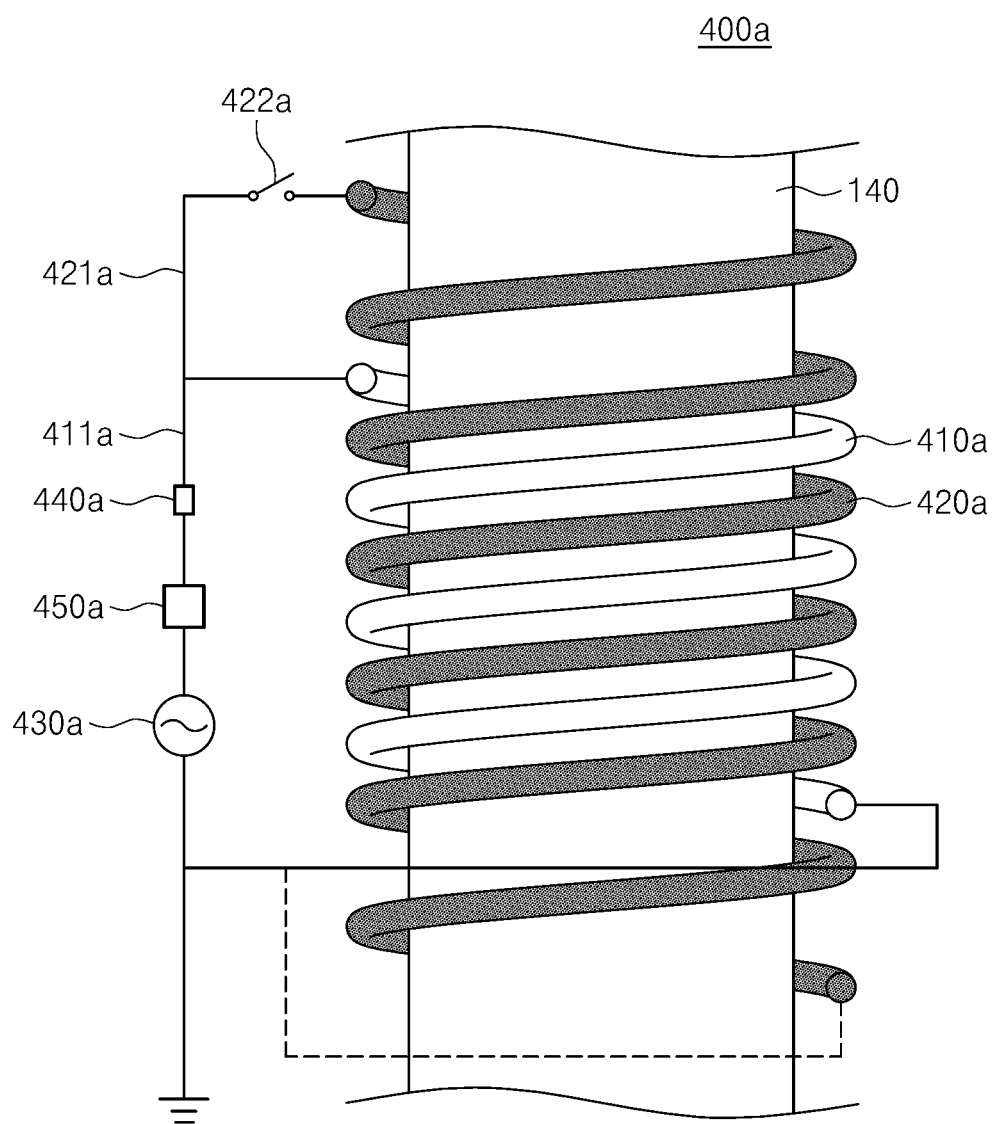
FIG. 7 is a view illustrating an antenna unit according to a second embodiment.

FIG. 7 is a view illustrating an antenna unit according to a second embodiment.

Referring to FIG. 7, the antenna unit 400a includes a first antenna 410a and a second antenna 420a.

The first antenna 410a is provided to surround an outer circumference of the plasma generating chamber 140 a plurality of times.

The second antenna 420a is provided to surround an outer circumference of the plasma generating chamber 140 a plurality of times. A length between a third location corresponding to an upper end of the plasma generating chamber 140, on which the second antenna 420a is wound, and a fourth location corresponding to a lower end of the plasma generating chamber 140 is longer than a length between a first location corresponding to an upper end of the plasma generating chamber 140, on which the first antenna 410a is wound, and a second location corresponding to a lower end of the plasma generating chamber 140. As an example, the second antenna 420a may be wound to include an area in which the first antenna 410a is wound. Further, the upper end of the second antenna 420a may be located above the upper end of the first antenna 410a, and the lower end of the second antenna 420a may be located below the lower end of the first antenna 410a.

When the plasma is initially ignited, the excitation of the plasma is initiated by the first antenna 410a in a narrow area so that the plasma may be effectively ignited.

The second antenna 420a is distributed over an area that is larger than the first antenna 410a. Accordingly, if the second antenna 420a is connected, an area in which the plasma is excited by the antenna unit 400a is dispersed. Accordingly, the heat generated in a process of exciting the plasma is dispersed so that the temperatures of the plasma and the plasma generating chamber 140a may be prevented from being increased excessively.

An electric wire 411a connecting the first antenna 410a to the power source 430a, an auxiliary electric wire 422a connecting the second antenna 420a to the power source 430a, a switch 422a located in the auxiliary electric wire 422a, a sensor 440a located in the electric wire 411a, and a matching circuit 450a are the same as or similar to those of the antenna unit 440 of FIG. 2, and thus a repeated description thereof will be omitted.

Figure 8:
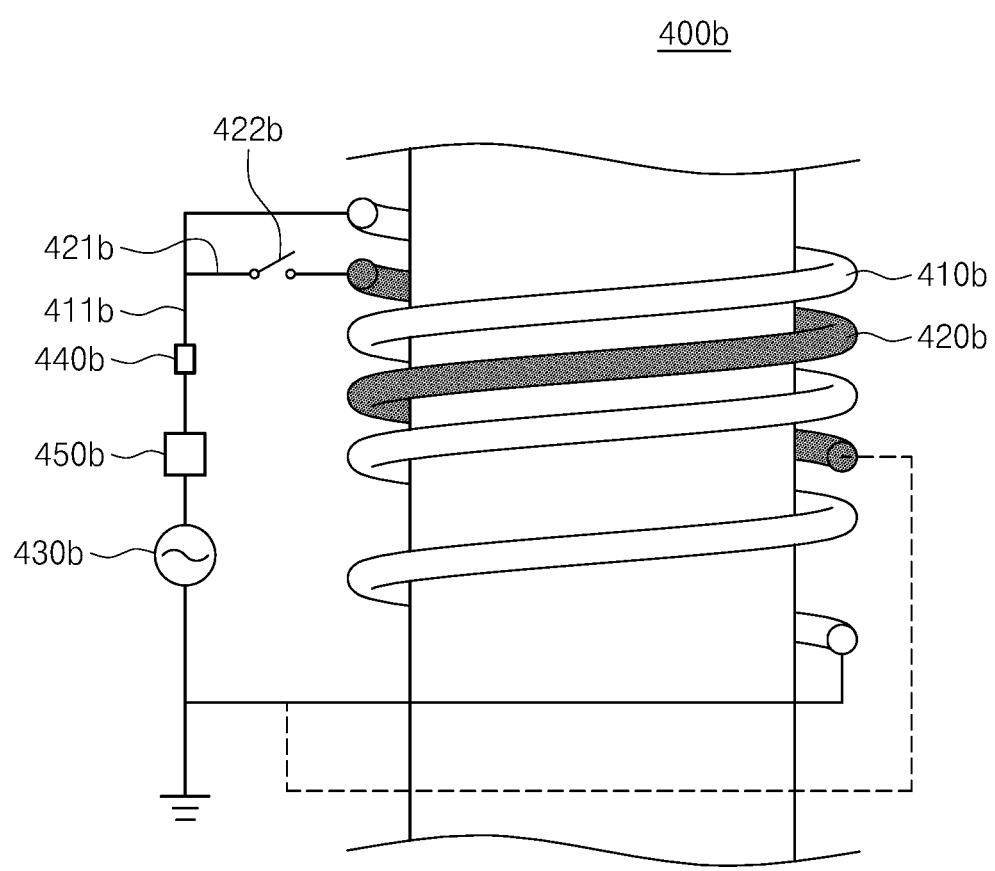
FIG. 8 is a view illustrating an antenna unit according to a third embodiment.

FIG. 8 is a view illustrating an antenna unit according to a third embodiment.

Referring to FIG. 8, the antenna unit 400b includes a first antenna 410b and a second antenna 420b.

The first antenna 410b is provided to surround an outer circumference of the plasma generating chamber 140 a plurality of times.

The second antenna 420b is provided to surround an outer circumference of the plasma generating chamber 140 a plurality of times. A length between an upper end and a lower end of the plasma generating chamber 140, on which the second antenna 420 is wound, is shorter than a length between an upper end and a lower end of the plasma generating chamber 140, on which the first antenna 410b is wound. As an example, the second antenna 420b may be wound to include an area in which the first antenna 410b is wound. Further, the upper end of the second antenna 420b may be located above the upper end of the first antenna 410b, and the lower end of the second antenna 420b may be located below the lower end of the first antenna 410b.

An electric wire 411a connecting the first antenna 410b to the power source 430b, an auxiliary electric wire 422b connecting the second antenna 420b to the power source 430b, a switch 422b located in the auxiliary electric wire 422b, a sensor 440b located in the electric wire 411b, and a matching circuit 450b are the same as or similar to those of the antenna unit 440 of FIG. 2, and thus a repeated description thereof will be omitted.

Figure 9:
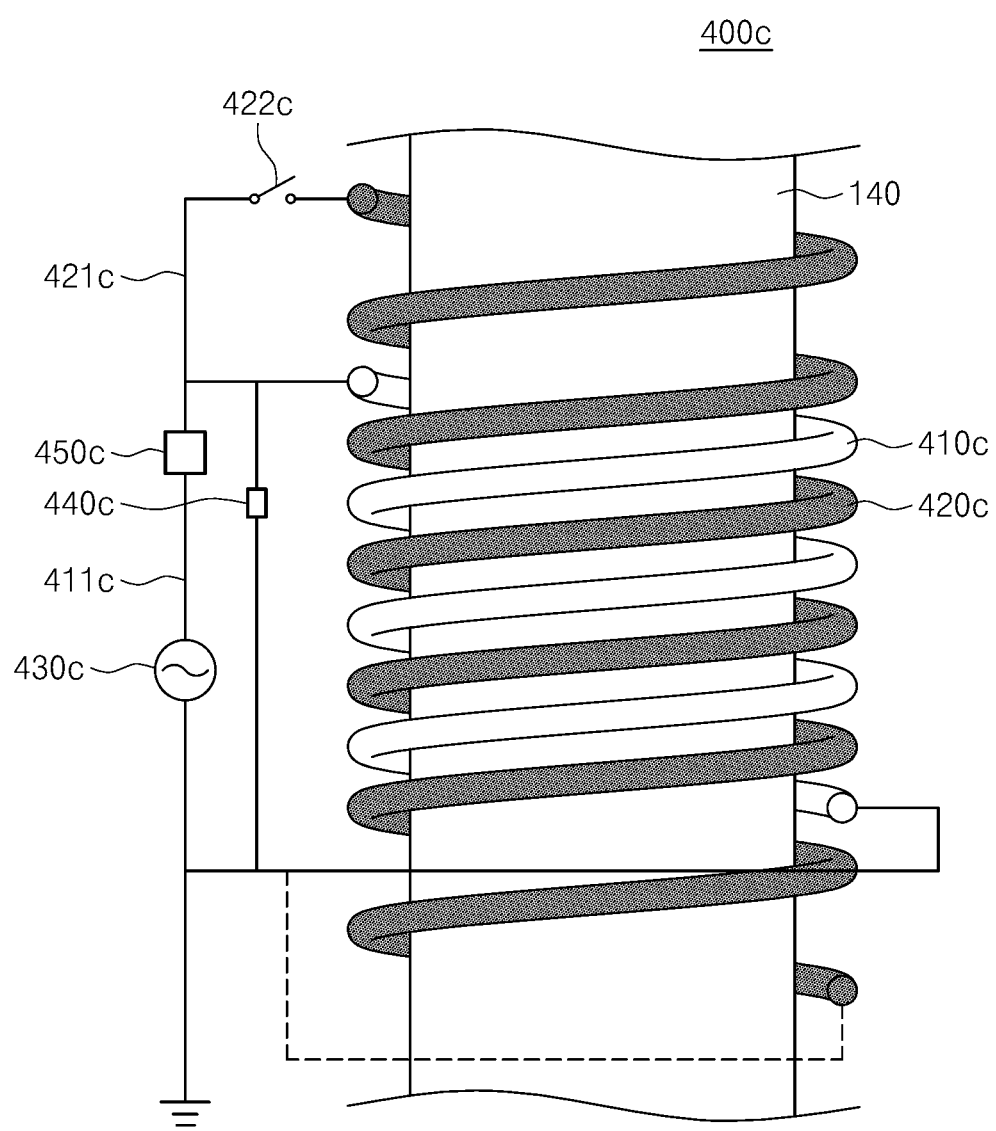
FIG. 9 is a view illustrating an antenna unit according to a fourth embodiment.

FIG. 9 is a view illustrating an antenna unit according to a fourth embodiment.

Referring to FIG. 9, the antenna unit 400c includes a first antenna 410c, a second antenna 420c, and a sensor 440c.

The sensor 440c may be provided as a voltmeter connected in parallel to the first antenna 410c. The voltmeter may be a high frequency voltmeter to be operated in a power source 430a having a high frequency wave. Accordingly, if the deviation of the voltage applied to the first antenna 410c with respect to a normal state voltage is a preset value or less after the ignition of the plasma is initiated, the controller 70 may determine that the state of the plasma becomes stable and may switch on the switch 422c. Further, if the state is maintained for a preset time period after the deviation of the voltage applied to the first antenna 410 with respect to the normal state voltage is a preset value or less, the controller 70 may switch on the switch 422.

A first antenna 410c, a second antenna 420c, an electric wire 411c connecting the first antenna 410c to the power source 430c, a matching circuit 450c, an auxiliary electric wire 422c connecting the second antenna 420c to the power source 430c, and a switch 422c located in the auxiliary electric wire 422c are the same as or similar to those of the antenna unit 440 of FIG. 2, the antenna unit 440a of FIG. 7, or the antenna unit 440b of FIG. 8, and thus a repeated description thereof will be omitted.

Figure 10:
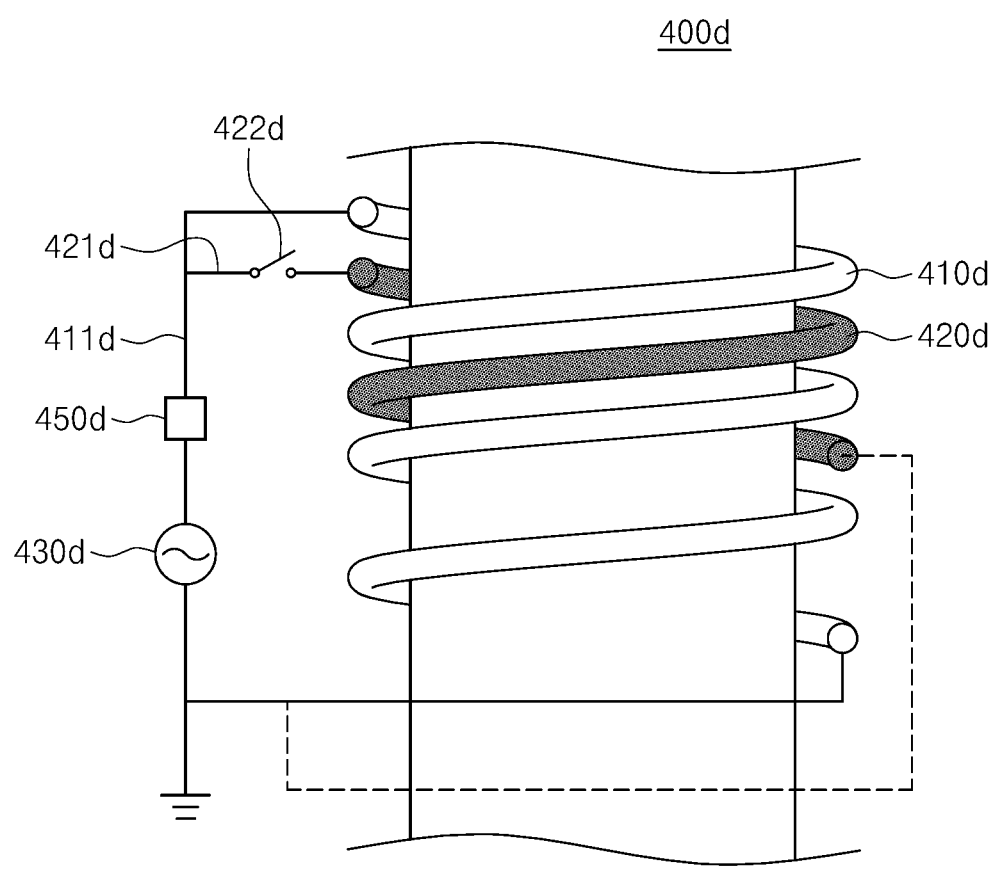
FIG. 10 is a view illustrating an antenna unit according to a fifth embodiment.

FIG. 10 is a view illustrating an antenna unit according to a fifth embodiment.

Referring to FIG. 10, the antenna unit 400d includes a first antenna 410d, a second antenna 420d, and a matching circuit 450d.

The matching circuit 450d performs impedance matching. The matching circuit 450d functions as a sensor.

If the ignition of the plasma is initiated, the plasma includes charged particles so that a mutual inductance is generated between the antenna unit 400d and the plasma. After the ignition of the plasma is initiated, a change degree of a value of a mutual inductance over time is high before the state of the plasma becomes stable. Accordingly, as the change of the impedance of the antenna unit 400d increases, a degree by which the impedance of the matching circuit 450d changes over time also increases and the change of the matching position of the matching circuit 450d becomes large. The controller 70 determines that the state of the plasma becomes stable if the change of the matching position of the matching circuit 450d is a preset value or less, and may perform a control to switch on the switch 422d.

An electric wire 411d connecting the first antenna 410d to the power source 430d, an auxiliary electric wire 422d connecting the second antenna 420d to the power source 430d, and a switch 422d located in the auxiliary electric wire 422d are the same as or similar to those of the antenna unit 440 of FIG. 2, the antenna unit 400a of FIG. 7, and the antenna unit 400b of FIG. 8, and thus a repeated description thereof will be omitted.

According to an embodiment of the inventive concept, a substrate treating apparatus that efficiently treats a substrate, a substrate treating method, and a plasma generating unit may be provided.

According to an embodiment of the inventive concept, a substrate treating apparatus that efficiently excites plasma, a substrate treating method, and a plasma generating unit may be provided.

According to an embodiment of the inventive concept, a substrate treating apparatus that may control heat generated in a process of exciting plasma, a substrate treating method, and a plasma generating unit may be provided.

The above description exemplifies the inventive concept. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. Accordingly, the detailed description of the inventive concept is not intended to restrict the inventive concept in the disclosed embodiment state. Furthermore, it should be construed that the attached claims include other embodiments.

What is claimed is:

1. A substrate treating method comprising:
   initiating ignition of plasma by connecting a first antenna wound on an upper portion of a chamber to a power source;
   determining a state of impedance in the first antenna with a controller based on current flowing through the first antenna; and
   if after the ignition of the plasma is initiated, the controller determines that a preset time period has elapsed after the ignition of the plasma, connecting a second antenna to the first antenna in parallel.

2. The substrate treating method of claim 1, wherein the second antenna is connected to the first antenna if a deviation value of a current flowing through the first antenna with respect to a normal state current is a preset value or less, after the ignition of the plasma is initiated.

3. The substrate treating method of claim 1, wherein the second antenna is connected to the first antenna if a deviation value of a voltage applied to the first antenna with respect to a normal state voltage is a preset value or less, after the ignition of the plasma is initiated.

4. The substrate treating method of claim 1, wherein the second antenna is wound in the same direction as the first antenna.

5. The substrate treating method of claim 1, wherein a length between an upper end and a lower end of the second antenna is longer than a length between an upper end and a lower end of the first antenna.

6. The substrate treating method of claim 1, wherein power is supplied to each of the first antenna and the second antenna by a single power source.

7. The substrate treating method of claim 1, wherein the state of impedance of the first antenna is directly measured by a sensor connected with the first antenna.

8. A substrate treating method comprising:
   initiating ignition of plasma by connecting a first antenna wound on an upper portion of a chamber to a power source;
   determining a state of impedance in the first antenna with a controller based on current flowing through the first antenna; and
   when after the ignition of the plasma is initiated, the controller determines that a deviation value of a current flowing through the first antenna with respect to a normal state current is a preset value or less, connecting a second antenna to the first antenna in parallel.

9. The substrate treating method of claim 8, wherein when after the ignition of the plasma is initiated, the controller determines that a preset time period has elapsed, connecting the second antenna to the first antenna in parallel.

10. The substrate treating method of claim 9, wherein power is supplied to each of the first antenna and the second antenna by a single power source.

11. The substrate treating method of claim 8, wherein the state of impedance of the first antenna is directly measured by a sensor connected with the first antenna.

* * * * *